United States Patent
Yakes et al.

(10) Patent No.: US 10,483,417 B2
(45) Date of Patent: Nov. 19, 2019

(54) CAPACITIVE INFRARED PHOTODETECTOR COMPRISING A QUANTUM DOT LAYER

(71) Applicant: The Government of the United States of America, as represented by the Secretary of the Navy, Arlington, VA (US)

(72) Inventors: Michael K. Yakes, Alexandria, VA (US); María González, Alexandria, VA (US); Phillip Jenkins, Cleveland Heights, OH (US); Robert J. Walters, Alexandria, VA (US); Antonio Martí Vega, Madrid (ES); Elisa Antolín Fernández, Madrid (ES); Esther López Estrada, Toledo (ES)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 162 days.

(21) Appl. No.: 15/903,259

(22) Filed: Feb. 23, 2018

(65) Prior Publication Data
US 2018/0248058 A1    Aug. 30, 2018

Related U.S. Application Data

(60) Provisional application No. 62/462,957, filed on Feb. 24, 2017.

(51) Int. Cl.
*H01L 31/0352* (2006.01)
*H01L 31/101* (2006.01)
(Continued)

(52) U.S. Cl.
CPC ......... *H01L 31/035218* (2013.01); *H01L 27/14652* (2013.01); *H01L 31/101* (2013.01); *H01L 31/103* (2013.01); *H01L 31/105* (2013.01)

(58) Field of Classification Search
CPC .......... H01L 31/035218; H01L 31/101; H01L 31/103; H01L 31/105; H01L 31/09;
(Continued)

(56) References Cited

U.S. PATENT DOCUMENTS 6,184,538 B1 * 2/2001 Bandara ............... B82Y 20/00
250/338.4
6,239,449 B1 5/2001 Fafard et al.
(Continued)

FOREIGN PATENT DOCUMENTS

JP    2016162989 A    9/2016

OTHER PUBLICATIONS

T.W. Case, "Thalofide Cell—A New Photo-Electric Substance," Physical Review 15, 289 (1920).
(Continued)

*Primary Examiner* — Que Tan Le
*Assistant Examiner* — Jennifer D Bennett
(74) *Attorney, Agent, or Firm* — US Naval Research Laboratory; Joslyn Barritt

(57) ABSTRACT

A semiconductor device that utilizes intraband photon absorption in quantum dots to provide a capacitive photodetector. The presence of the quantum dots creates confined energy states within the photodetector device. Electrons are trapped in these confined energy states. When the photodetector is illuminated by light having an appropriate photon energy, the stored electrons are released to the conduction band, causing a change in the capacitance of the photode-
(Continued)

tector. By measuring this change in capacitance, light incident on the photodetector can be detected and quantified.

12 Claims, 9 Drawing Sheets

(51) Int. Cl.
*H01L 31/103* (2006.01)
*H01L 31/105* (2006.01)
*H01L 27/146* (2006.01)

(58) Field of Classification Search
CPC .......... H01L 27/1446; H01L 27/14652; Y02E 10/50; Y02E 10/549; Y02E 60/13; G01J 1/00; G01J 1/46; G01J 2001/448
See application file for complete search history.

(56) References Cited

U.S. PATENT DOCUMENTS

| | | | |
|---|---|---|---|
| 6,720,589 B1* | 4/2004 | Shields | ................. B82Y 10/00 257/14 |
| 6,906,326 B2 | 6/2005 | Koch et al. | |
| 2004/0118992 A1 | 6/2004 | Choe et al. | |
| 2005/0017176 A1* | 1/2005 | Koch | ..................... B82Y 10/00 250/338.4 |
| 2006/0266998 A1 | 11/2006 | Vega et al. | |
| 2014/0050242 A1* | 2/2014 | Taylor | ................. H01L 29/0688 372/45.012 |

OTHER PUBLICATIONS

S. Chakrabarti et al., "High-performance, long-wave (~10.2 μm) InGaAs/GaAs quantum dot infrared photodetector with quaternary In0.21Al0.21Ga0.58As capping," Appl. Phys. Lett. 99, 181102 (2011).
B. F. Levine, "Quantum-well infrared photodetectors," J. Appl. Phys. 74, R1 (1993).
W. W. Gartner,"Depletion-layer Photoeffects in Semiconductors," Physical Review 116, 84 (1959).
W. S. Boyle and G. E. Smith, "Charge Coupled Semiconductor Devices," Bell System Technical Journal 49, 587 (1970).
M. F. Tompsett, G. F. Amelio, and G. E. Smith, "Charge Coupled 8-Bit Shift Register," Appl. Phys. Lett. 17, 111 (1970).
Search Report and Written Opinion dated May 30, 2018 in corresponding International Patent Application No. PCT/US2018/019368.
Boaz Kochman et al., "Absorption, Carrier Lifetime, and Gain in InAs—GaAs Quantum-Dot Infrared Photodetectors," IEEE Journal of Quantum Electronics, vol. 39, No. 3, Mar. 2003, pp. 459-467.

* cited by examiner

US 10,483,417 B2

CAPACITIVE INFRARED PHOTODETECTOR COMPRISING A QUANTUM DOT LAYER

CROSS-REFERENCE

This Application is a Nonprovisional of and claims the benefit of priority under 35 U.S.C. § 119 based on U.S. Provisional Patent Application No. 62/462,957 filed on Feb. 24, 2017. The Provisional Application and all references cited herein are hereby incorporated by reference into the present disclosure in their entirety.

TECHNICAL FIELD

The present invention relates to photodetectors, particularly to capacitive photodetectors.

BACKGROUND

Photodetectors are electronic devices engineered to detect light. This light can be visible light or invisible light, such as infrared or ultraviolet light. Detecting and quantifying light in the visible range allows to take pictures of what we see. Detecting and quantifying light in the invisible allows us to explore and, ideally, take pictures of what we do not see.

Photodetectors based on semiconductors can be classified in different classes according to the physical principle being exploited in order to detect light.

In the "photoconductor" class, light is detected by measuring the change in the electrical conductivity of the semiconductor caused by the absorption of light. The first photoconductor was demonstrated by T. W. Case in 1920. See T. W. Case, "Thalofide Cell—A New Photo-Electric Substance," *Physical Review* 15, 289 (1920). Some recent photoconductors utilize an intraband absorption in quantum dots or quantum wells. See, e.g., S. Chakrabarti et al., "High-performance, long-wave (~10.2 µm) InGaAs/GaAs quantum dot infrared photodetector with quaternary In0.21Al0.21Ga0.58As capping," *Appl. Phys. Lett.* 99, 181102 (2011); and B. F. Levine, "Quantum-well infrared photodetectors," *J. Appl. Phys.* 74, R1 (1993).

In the "photodiode" class, light is detected via the photocurrent induced in a p-n or metal-semiconductor junction. One of the early studies of photodetector theory is attributed to W. W. Gartner, who examined such devices in the 1950s. See, e.g., W. W. Gartner, "Depletion-layer Photoeffects in Semiconductors," *Physical Review* 116, 84 (1959).

In the "capacitive" class of photodetectors, detection takes place by exploiting the sensitivity of the capacitance of the given semiconductor device to light. An example of the latest is the metal-oxide-semiconductor capacitor (MOS-C) used in charge-coupled devices (CCDs) which was first mentioned by Boyle and Smith in 1970. See W. S. Boyle and G. E. Smith, "Charge Coupled Semiconductor Devices," Bell System Technical Journal 49, 587 (1970).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a semiconductor device that utilizes intraband photon absorption in quantum dots to provide a capacitive photodetector.

In exemplary embodiment, a capacitive photodetector in accordance with the present invention takes the form of a semiconductor device that includes a semi-insulating semiconductor substrate; a highly doped n-type semiconductor layer ("n+ layer") grown on top of the substrate; and an n-type semiconductor layer (QD layer) having quantum dots (QDs) embedded therein grown on top of the n+ layer; and an n-type semiconductor layer ("n-layer") grown on top of the QD layer. The structure further includes a highly doped p-type semiconductor layer ("p+ layer") grown on top of the n-layer; a metal contact deposited on top of the p+ layer; and one or more metal contacts deposited on top of the n+ layer after the p+ layer, the QD layer and the n-layer are etched away.

The QD layer has a doping level that fills the electronic confined states in the quantum dots with electrons, while the n-layer has a thickness and has a doping level such that its thickness in included within the device's depletion region.

The presence of the quantum dots creates confined energy states within the photodetector device. Electrons are trapped in these confined energy states. When the photodetector is illuminated by light having an appropriate photon energy, the stored electrons are released to the conduction band, causing a change in the capacitance of the photodetector. By measuring this change in capacitance, light incident on the photodetector can be detected and quantified. The use of quantum dots as opposed to quantum wells allows the use of front illumination to excite electrons from the confined states to the conduction band.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a new capacitive photodetector. Unlike existing capacitive photodetectors which rely on photon absorption by means of the creation of a conventional electron-hole pair, the capacitive photodetector in accordance with the present invention relies on intraband photon absorption in quantum dots. Although there are photodetectors that also exploit this intraband absorption in quantum dots, see Chakrabarti, supra, or quantum wells, see Levine, supra, such devices belong to the "photoconductor" class and not to the "capacitive" class.

Making a photodetector whose operation is based on changes in capacitance is more challenging than making a photodetector based on changes in photoconductivity because a capacitive photodetector requires storage of the electric charge while the second does not; such a photodetector, which exploits both capacitive effects and intraband photon absorption, requires the new device structure of the present invention. By enabling the storage of electric charge, the quantum dot-based capacitive photodetector in accordance with the present invention can be used in charge-coupled devices (CCDs) for detection and registration of images in the infrared, while a quantum dot-based photoconductor, which does not store charge, cannot.

Aspects of the present invention will now be described with reference to the FIGURES which are submitted with and form a part of the present disclosure.

Figure 1:
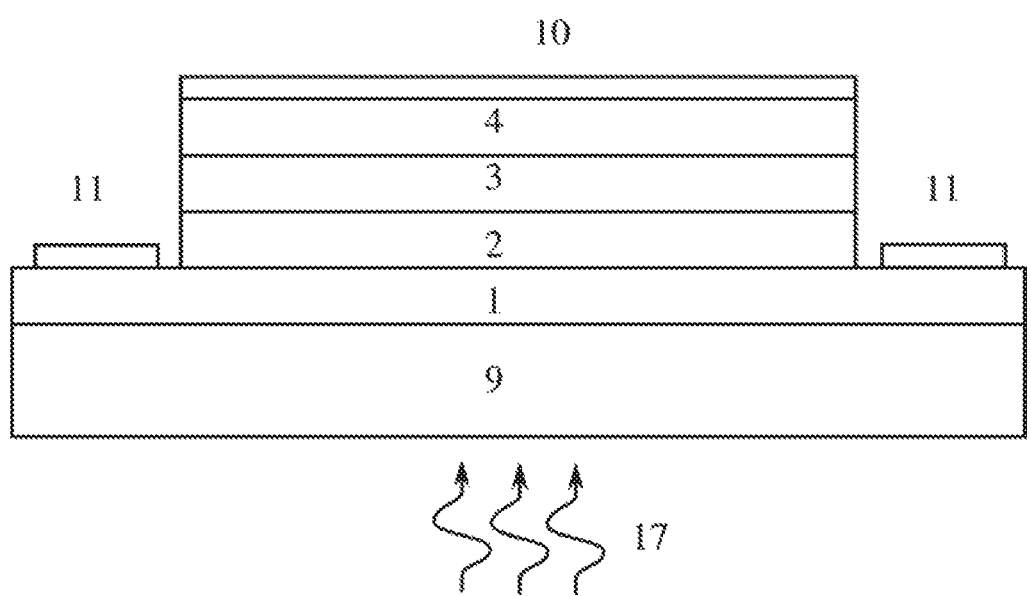
FIG. 1 is a block schematic illustrating aspects of a first exemplary semiconductor layer structure for a quantum dot-based capacitive infrared photodetector in accordance with the present invention.

The block schematic in FIG. 1 illustrates aspects of a semiconductor structure in a first exemplary embodiment of a capacitive infrared photodetector in accordance with the present invention.

As described in more detail below, this embodiment of a capacitive infrared photodetector in accordance with the present invention includes a substrate 9; a highly doped n-type semiconductor layer ("n+ layer") 1 grown on top of the substrate; and a quantum dot layer (QD layer) 2 grown on top of the n+ layer, the QD layer comprising a plurality of quantum dots (QDs) embedded within an n-type semiconductor material layer, for example a plurality of InAs quantum dots embedded within a n-type GaAs semiconductor layer. The structure further includes an n-type semiconductor layer ("n-layer") 3 grown on top of QD layer 2; a highly doped p-type semiconductor layer ("p+ layer") 4 grown on top of the n-layer; one or more metal contacts 11 deposited on top of n+ layer 1 after portions of p+ layer 4, n-layer 3, and QD layer 2 are etched away, and a metal contact 10 deposited on top of the remaining portion of p+ layer 4. In other embodiments, the polarity of the device can be reversed, with the heterostructure including a highly doped p-type semiconductor layer ("p+ layer") grown on top of the substrate; a n-type layer grown on top of the p+ layer, a quantum dot layer (QD layer) grown on top of the n-layer, and a n+-type semiconductor layer ("n+-layer") grown on top of the QD layer.

Substrate 9 provides mechanical support to the device structure and allows growing the other layers upon it. In the embodiments in which light is incident on the substrate 9, such as in the embodiment described herein, substrate 9 will be semi-insulating in order to minimize free carrier absorption and maximize absorption of the incident light by the quantum dots, since if the substrate were highly doped, most of the infrared light incident on the structure would be absorbed by the substrate and not in the QD layer. Any suitable semi-insulating material can be used, such as GaAs, InP, GaSb, Si, Ge, GaN, or sapphire.

N+ layer 1 acts as a back contact to the device. It is made thin so that, in spite of being highly doped, free carrier absorption in this layer can be considered negligible. This layer is externally accessed by means of metallic contact(s) 11 placed at the perimeter of the device after the layers above this n+ layer are etched away. As described in more detail below, during the transient time immediately after the device is reverse biased, this layer also sets a limit to the width the depletion region can take and thus a lower bound to the value the capacitance of the device can take.

N-layer 3 is grown on an upper surface of QD layer 2 in order to maximize the number of quantum dots that contribute to infrared light absorption, and p+ layer 4 is a highly doped p-type layer whose role is to create a depletion region in the device. This depletion region is mainly in the n-region because the p-region is highly doped so that the portion of the depletion region that extends within the p+ region can be considered negligible. Although n-layer 3 can be omitted in some embodiments, omitting n-layer 3 raises the risk that quantum dots falling in the depletion region will not be capable of absorbing infrared light because the confined energy levels contained in this depletion region will be empty of electrons, and for this reason it is usually preferred that n-layer 3 be present.

The thickness and doping level of n-layer 3 are tailored so that, when the device is unbiased, the quantum dots in QD layer 2 are outside the depletion region and remain in a flat band region. As described in more detail below, when the device is reverse biased, this depletion region expands towards QD layer 2, with the voltage being fully used in depleting the QD region.

In alternative embodiments, p+ layer 4 can be replaced by a metal-semiconductor junction (Schottky junction) or a metal-insulating structure since these alternatives also are able to create a space charge region that can be expanded towards the QD region when a reverse voltage is applied.

Figure 2:
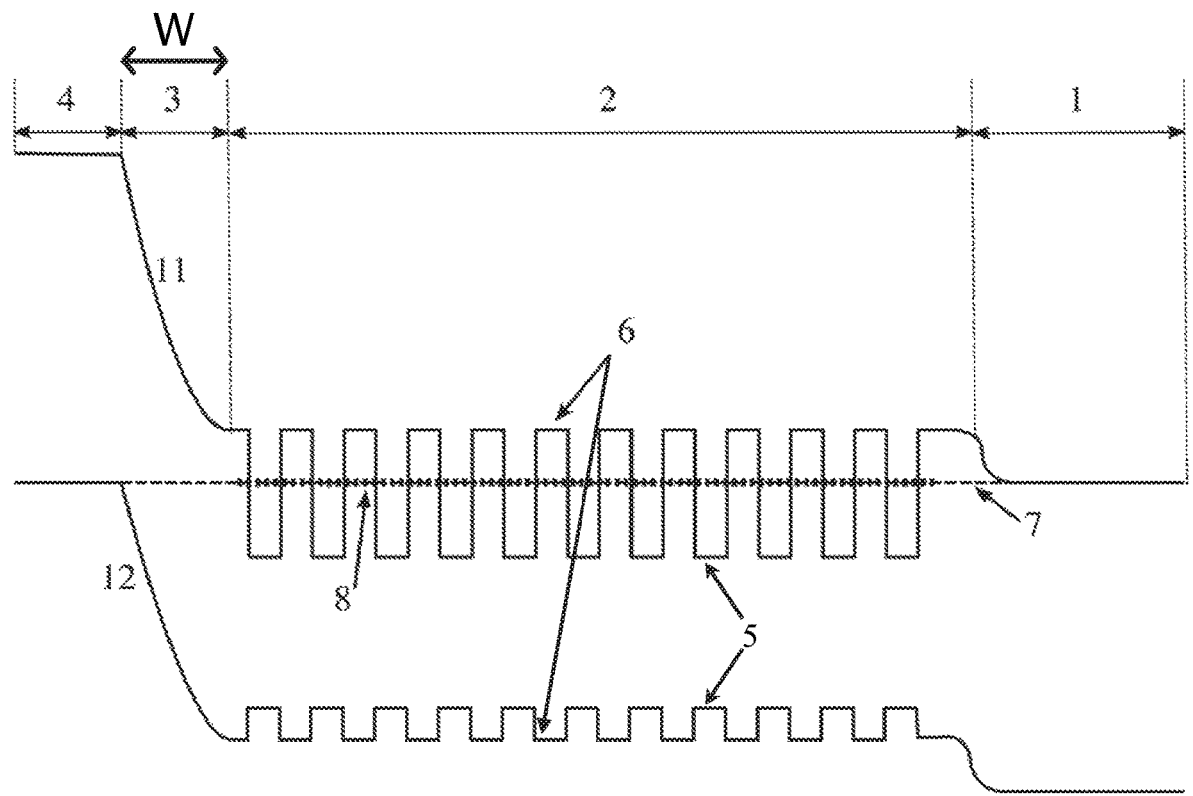
FIG. 2 is an energy band diagram illustrating equilibrium energy bands in a quantum dot-based capacitive infrared photodetector in accordance with the present invention.

The block schematic in FIG. 2 illustrates an equilibrium-state band diagram of a quantum dot-based capacitive infrared photodetector having the structure shown in FIG. 1, where the numbers 1, 2, 3, and 4 represent the corresponding material layers in the semiconductor structure described above. As shown in FIG. 2, line 11 represents the conduction band of the photodetector device in accordance with the present invention, and line 12 represents its valence band. As illustrated in FIG. 2, the energy gap between the conduction and valence bands of the quantum dots in QD layer 2 is represented by lines 5 shown in FIG. 2, while the energy gap of the semiconductor host material in QD layer 2 is represented by lines 6.

In most embodiments, the conduction and valence bands of the quantum dots and the semiconductor host will have a type-I band alignment, where the energy gap of the QD layer is smaller than that of the semiconductor host. Such an energy band structure causes the electrons in QD layer 2 to be confined, or "trapped," in the potential well created in the conduction band. The lowest possible confined electron energy, or "fundamental energy level" of the confined electrons is shown by dotted line 8, while the Fermi level of the device is represented by dashed line 7. For a QD layer comprising InAs quantum dots in a GaAs host matrix, the difference in this fundamental energy level of the confined electrons and the conduction band of the host is in the range of 0.4 eV.

This difference between the fundamental energy level of the confined electrons and the energy level of the conduction band determines the lowest energy (highest wavelength) of the photons that can be absorbed by the quantum dots and thus detected by the device. For example, for a QD layer comprising InAs quantum dots in a GaAs host, only light whose wavelength is associated with photons having an energy typically above 0.4 eV can be detected by the photodetector, while light having less energy (longer wavelengths) will simply pass through the device without being absorbed, i.e., without being detected.

In addition, the energy of the electrons confined in a quantum dot is dependent on its size; if the dot is made smaller, the energy of the confined electrons increases and the difference between the energy of the confined electrons the host energy decreases, while if the dot is made larger, the energy of the confined electrons decreases, increasing the difference between the energy of the confined energies and that of the host. Thus, by changing the size of the quantum dots, the energy of the photons—and thus the wavelength of the light—that can be detected can be tuned.

In its equilibrium state, the capacitance of the device is $\varepsilon/W$, where $\varepsilon$ is the average dielectric permittivity of the semiconductors used and $W$ is the thickness of the space charge region that ideally matches the thickness of the n-layer 3 on top of the QD layer.

Figure 4:
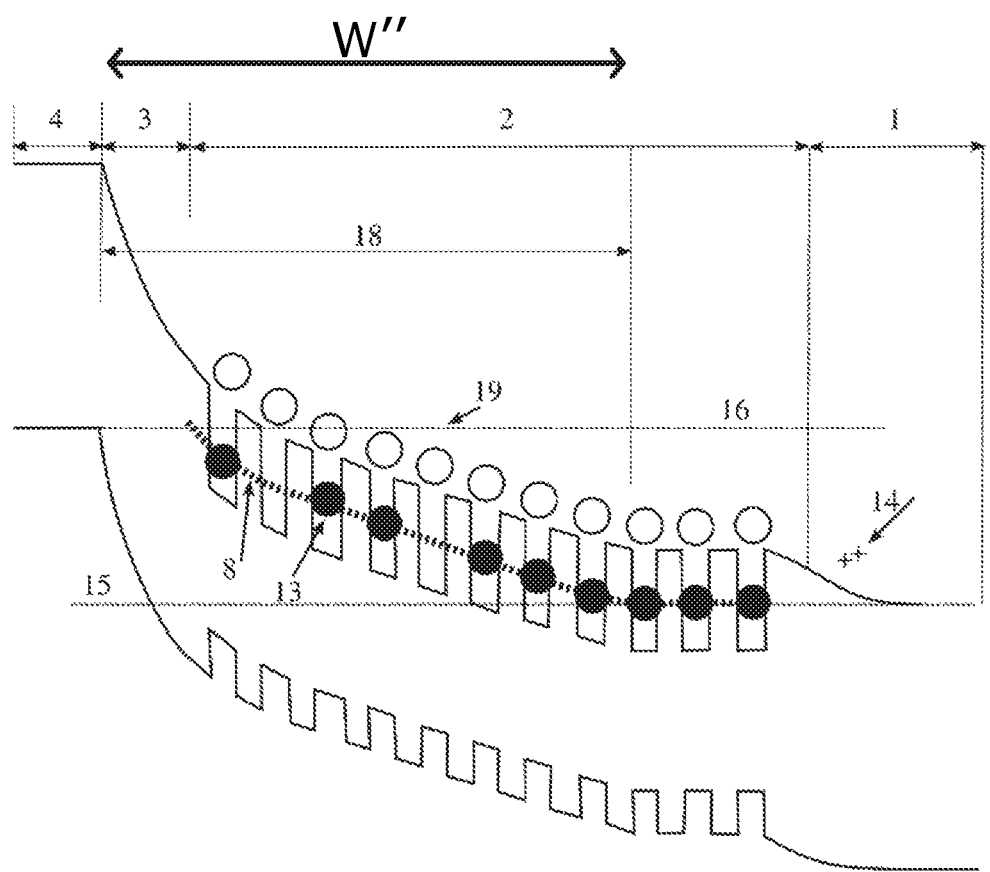
FIG. 4 is an energy band diagram illustrating energy bands in a quantum dot-based capacitive infrared photodetector in accordance with the present invention after application of a reverse bias voltage pulse to the device and before a steady state is reached.
Figure 5:
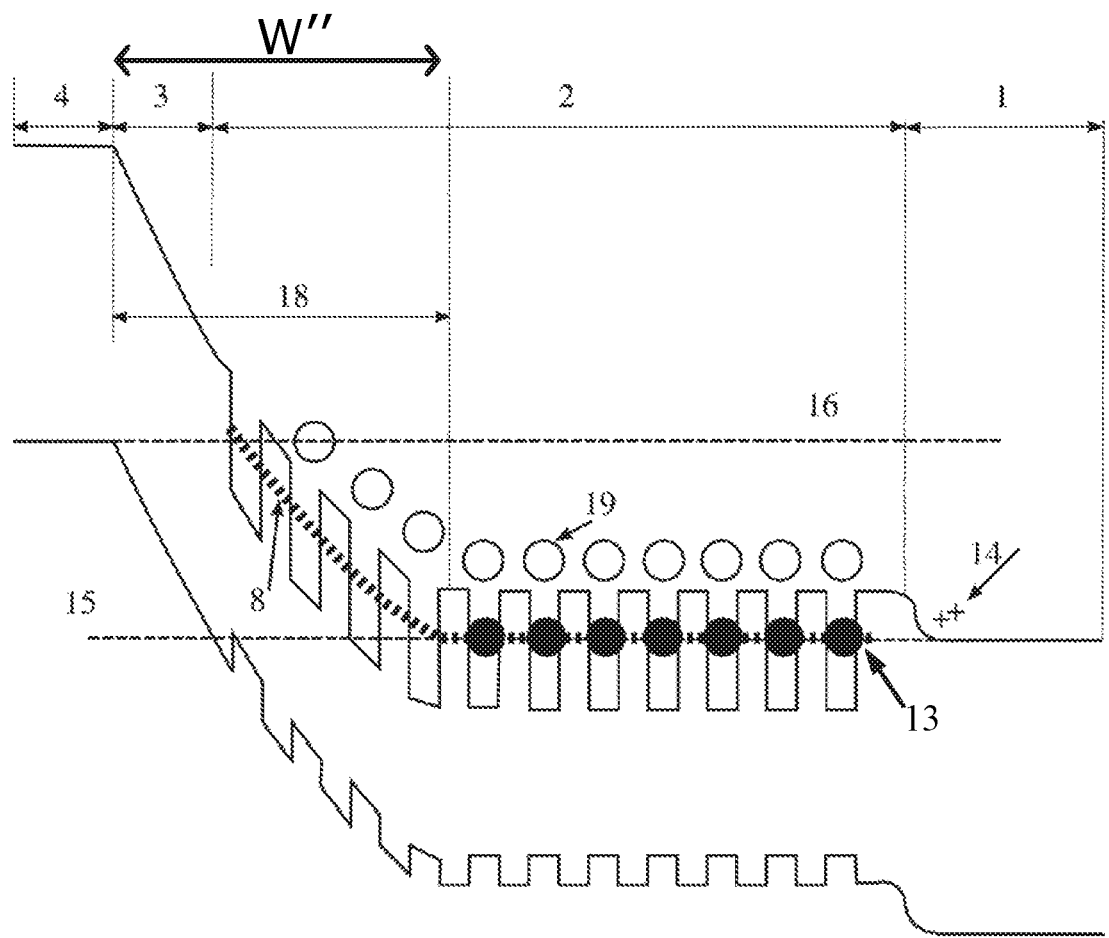
FIG. 5 is an energy band diagram illustrating energy bands in a quantum dot-based capacitive infrared photodetector in accordance with the present invention after a steady state is reached.

The operation of a quantum dot-based photodetector will now be described with reference to FIGS. 3-5, which illustrate aspects of the energy bands of the photodetector and illustrate the way in which such a structure can be used to detect light incident thereon.

As noted above, QD layer 2 is composed of a semiconductor host material having an array of semiconductor quantum dots embedded therein. In accordance with the present invention, the semiconductor host material is n-doped as represented by the hollow circles 19 shown in FIGS. 3-5, with the doping density being approximately equal to the density of the quantum dots embedded in the host such that the fundamental energy level of this semiconductor material layer becomes filled with electrons.

To enable the structure to detect light, the device is reverse biased by applying a negative voltage pulse to the p contact 10 with respect to the n contact 11.

Figure 3:
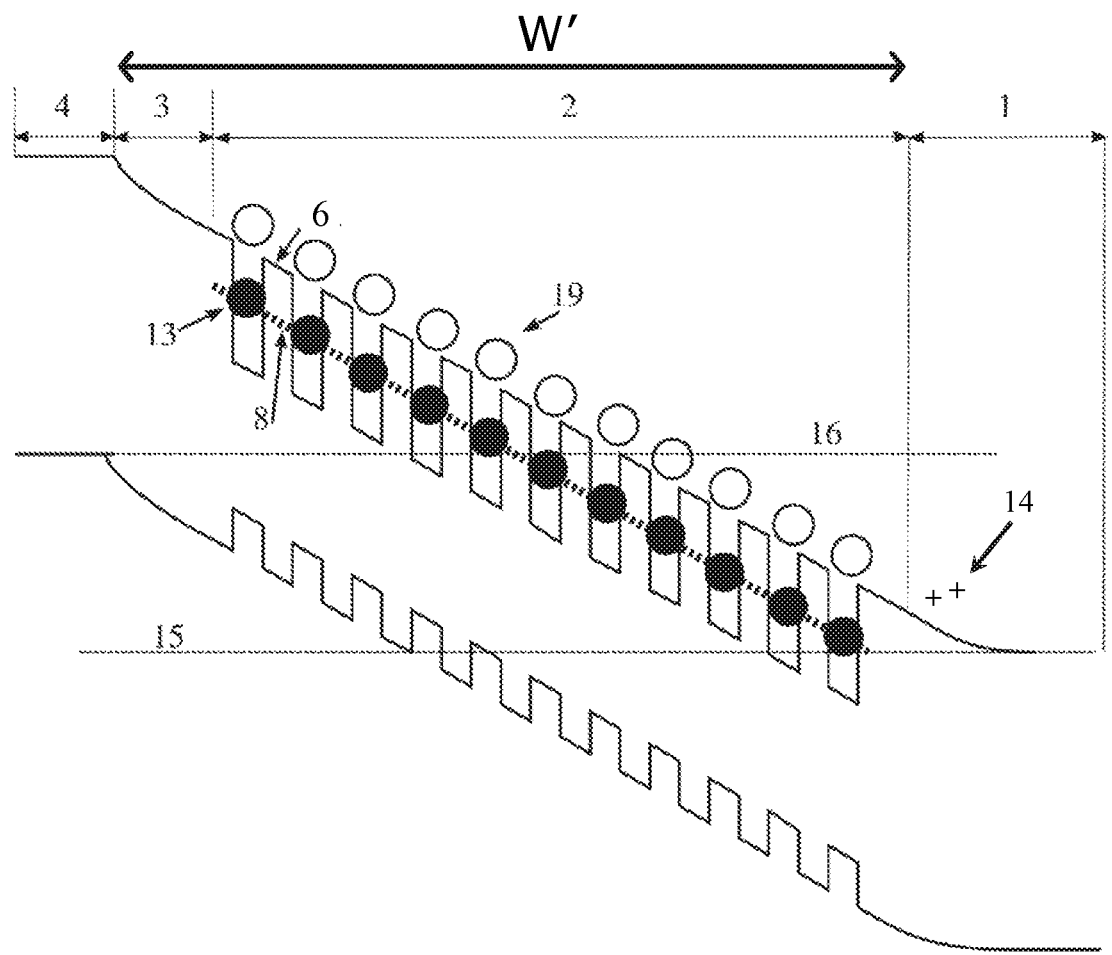
FIG. 3 is an energy band diagram illustrating energy bands in a quantum dot-based capacitive infrared photodetector in accordance with the present invention after application of a reverse bias voltage pulse to the device.

The block schematic in FIG. 3 shows the energy bands of the device in the non-equilibrium state just after application of the voltage pulse. As used in FIG. 3, reference numerals 1, 2, 3, 4, 6, and 8 refer to the same elements described above with respect to FIG. 2 and reference numerals 15 and 16 represent the electron and hole quasi-Fermi levels, respectively, in the semiconductor host material.

After the application of this voltage pulse, electrons and holes are excited out of the conduction and valence band respectively. However, electrons confined in the QDs, lacking sufficient energy to escape to the conduction band, are trapped within confined states in the quantum dots. These trapped electrons, represented by filled dots 13 shown in FIGS. 3-5, remain captured by the quantum dots until they are further excited with sufficient energy to escape. In order to compensate for the additional negative charge provide by the ionized acceptors in the p+ depletion region, the space charge region expands to W', and reaches highly n+ layer 1, whose positively ionized dopants provide the positive charge 14 required for charge neutrality. At this time, the non-equilibrium high-frequency (1 MHz) capacitance of the device at this stage is given by $\varepsilon/W'$, where the space charge region W' shown in FIG. 3 approximately corresponds to the thickness of QD layer 2 and n-layer 3; the width of the depletion region within n+ layer 1 is considered negligible and so is not considered as contributing to the capacitance of the device.

If no light is incident on the device, the trapped electrons can escape to the conduction band only by capturing thermal energy. This is a slow process that can be made even slower if the device is cooled to reduce the thermal energy available to the electrons. Eventually, however, the absorption of thermal energy will allow provide the electrons with sufficient energy and the device will evolve towards a steady state condition such as that shown in FIG. 5.

If, on the other hand, the device is exposed to light having a photon energy at least equal to the difference between the energy of the confined electrons 8 and the conduction band energy 6 in QD layer 2, that incident light is absorbed by the quantum dots and its photon energy is injected into the confined electrons. As illustrated by the band diagrams in FIGS. 4 and 5, the electrons in the quantum dot confined states 13 are pumped to the conduction band by the injection of the photon energy from the incident light and are transported towards the n+ depletion region 14 until the steady state condition, where no more electrons are excited into the conduction band, is reached.

Before this steady state is reached, the high-frequency capacitance of the device can be expressed as $\varepsilon/W''$, where $W''$ is the width 18 of the space charge region after the excitation of the electrons by the photon energy moves some of them into the conduction band. This capacitance $\varepsilon/W''$ resulting from the excitation of electrons in the QDs after they have been exposed to light is different from the transient capacitance $\varepsilon/W'$ just after the application of the voltage pulse and is indicative of the exposure of the QDs to light having a photon energy at least equal to the difference between the energy of the confined electrons 8 and the conduction band energy 6 in QD layer 2.

Thus, in accordance with the present invention, an incidence of infrared light on the device can be detected by measuring the capacitance of the device at a time t1, just after the application of the voltage pulse and then measuring the capacitance at a time t2 thereafter, before the device has reached a steady state where no more electrons move to the conduction band, and determining the change, if any, in the measured capacitances, i.e., $\varepsilon/W''-\varepsilon/W'$, wherein the change in capacitance is indicative of exposure of the device to light having an energy between the energy of the confined electrons in the QDs 8 and the energy of the conduction band 6 of the host material. In the case of a GaAs semiconductor matrix having InAs quantum dots therein, this energy difference (0.4 eV) corresponds to light having wavelengths in the infrared range, making a detector in accordance with the present invention particularly suited to the detection of infrared light. The degree of the difference between $\varepsilon/W''$ and $\varepsilon/W'$ is indicative of the intensity of the light to which the device has been exposed.

The time t2 at which the capacitance $\varepsilon/W''$ can be taken is determined by calibrating the device before it is used. The device is calibrated by applying a negative voltage pulse and measuring its capacitance at a time t1 immediately thereafter and then, without exposing the device to light (i.e., the electrons being excited only by thermal energy), measuring its capacitance at multiple times until the device reaches a steady state and the device no longer changes. The time at which the device reaches the steady state, sometimes referred to as the "relaxation time," represents the outer limit of the time t2 at which the capacitance can be measured to detect exposure of the device to light in a manner described above.

Figure 6:
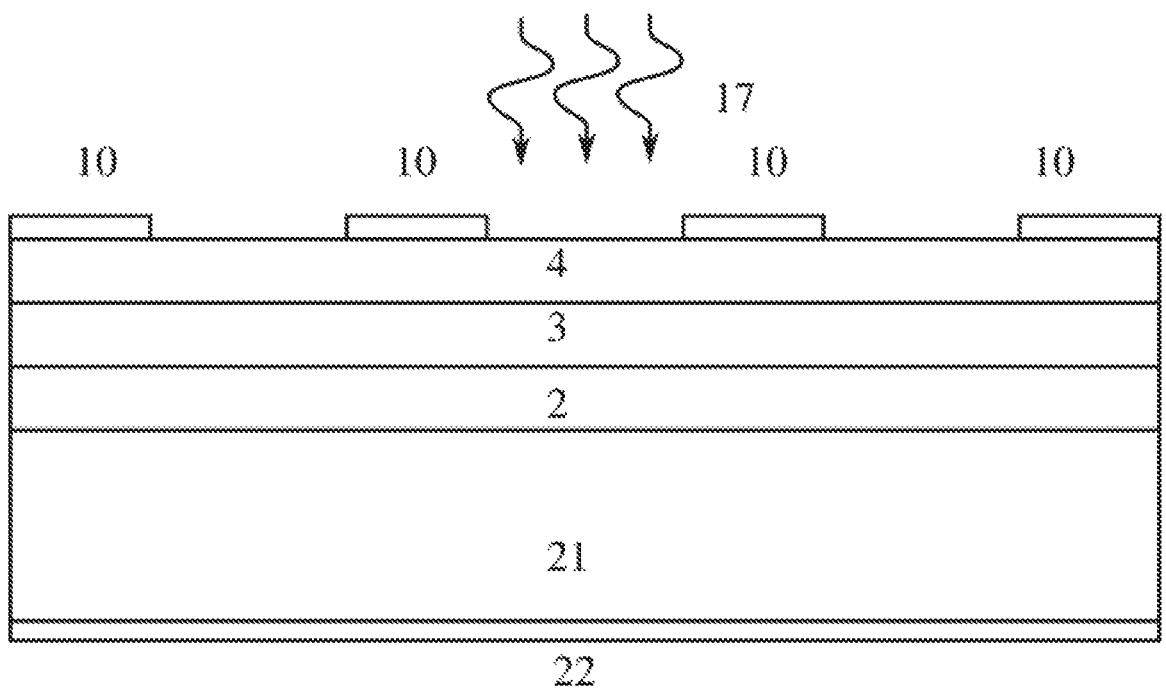
FIG. 6 is a block schematic illustrating aspects of a second exemplary semiconductor layer structure for a quantum dot-based capacitive infrared photodetector in accordance with the present invention.

The block schematic in FIG. 6 illustrates aspects of an alternative embodiment of a semiconductor device structure for a capacitive infrared photodetector in accordance with the present invention. In alternative embodiments, light is incident first on p+ layer 4, which is possible if the front metal contact 10 is semi-transparent, e.g., by taking the form of a grid. In such a case, use of a semi-insulating substrate is not necessary and an n+ substrate 21 can be used instead. Use of such an n+ substrate would make the n+ layer 1 redundant and therefore this layer could be eliminated from the structure. In such a case, the n-contact 22 can be placed directly on the backside of the substrate, opposite from the remaining layers in the structure. In some embodiments, an n+ layer (not shown) can be grown between the n-layer 3 and the substrate 21 as an epitaxial buffer layer if desired to improve the crystalline quality of the structure.

Figure 7A:
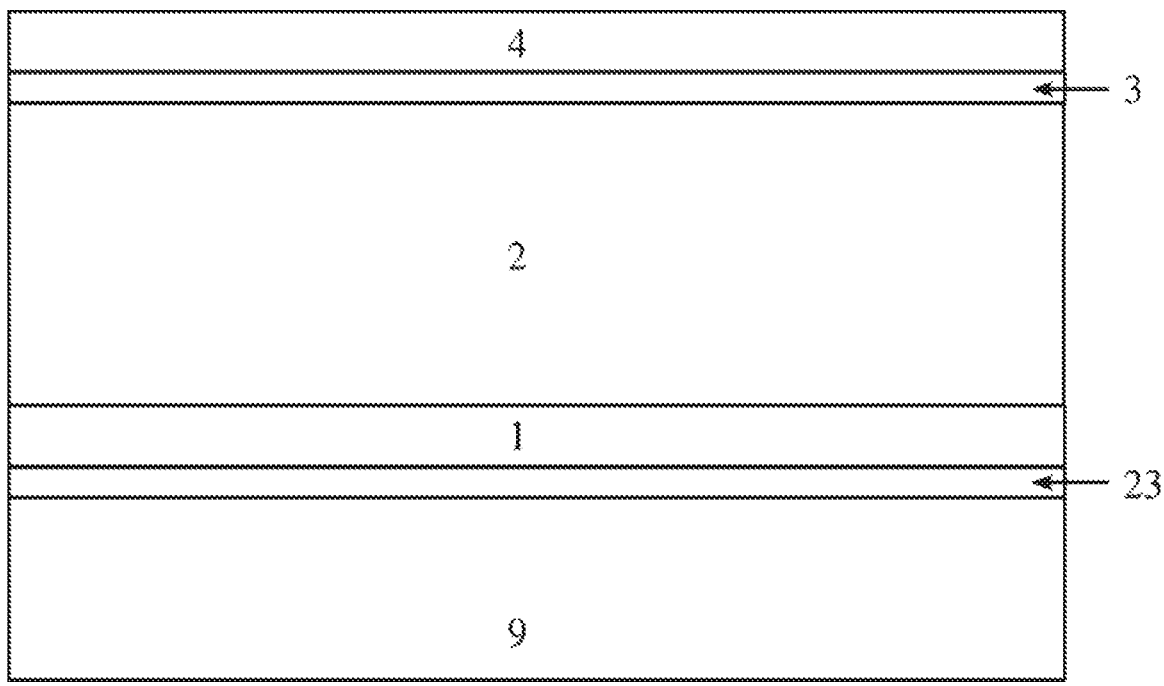
FIGS. 7A-7C are block schematics illustrating aspects of a process for manufacturing a quantum dot-based capacitive infrared photodetector in accordance with the present invention.
Figure 7B:
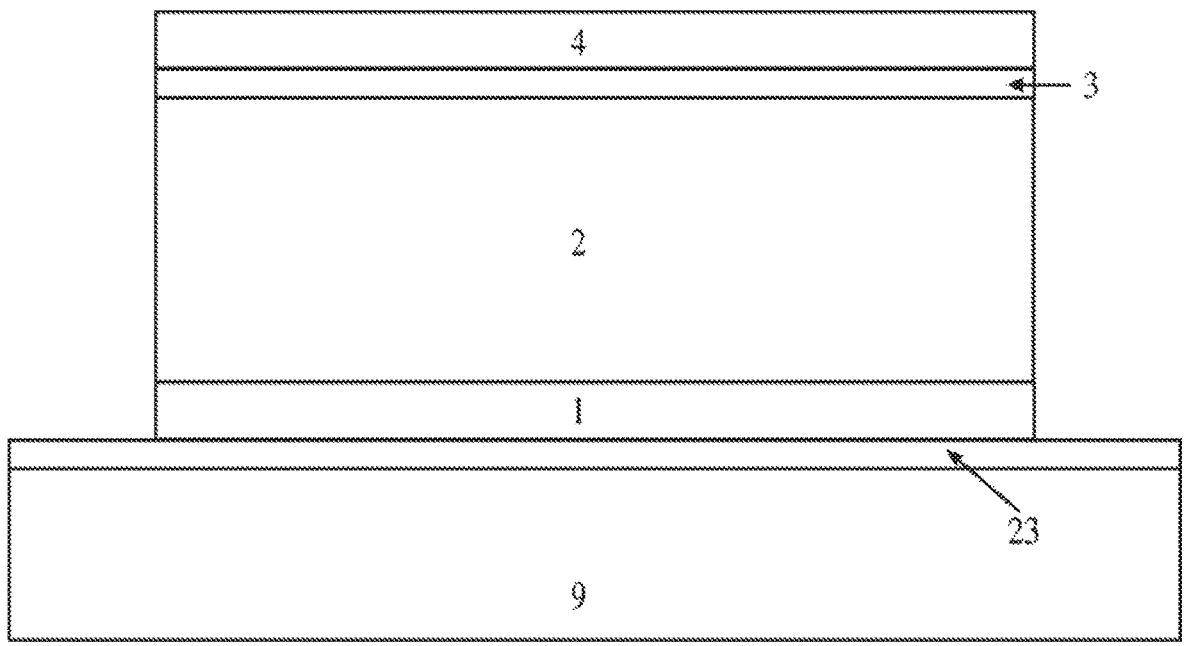
Figure 7C:
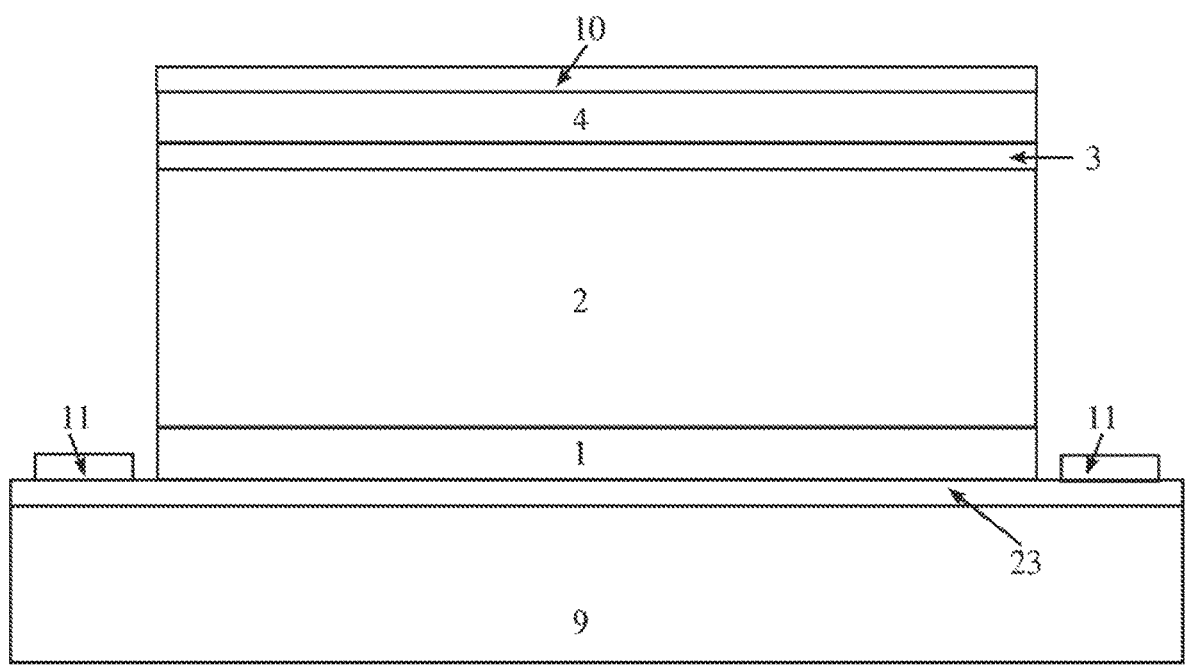

In certain embodiments, capacitive infrared photodetectors in accordance with the present invention can be fabricated by means of molecular beam epitaxy (MBE). FIGS. 7A-7C illustrate aspects of an exemplary process by which a capacitive infrared photodetector in accordance with the present invention can be fabricated.

It should be noted that the specific materials, material layer thicknesses, and processing conditions described below are merely exemplary; other materials, material layer thicknesses, and processing conditions may be employed as appropriate to form a capacitive infrared photodetector in accordance with the present invention, and all such variations on the specific cases described below are deemed to be within the scope of the present disclosure.

FIG. 7A illustrates the aspects of the formation of the material layers used in a capacitive infrared photodetector in accordance with the present invention.

Thus, to start the processing of a capacitive infrared photodetector in accordance with the present invention, a 200 μm-thick semi-insulating GaAs substrate 9 is loaded into an MBE growth chamber. The substrate provides mechanical support to the solar cell while also being transparent to long-wavelength infrared radiation.

Oxides on the surface of the GaAs substrate can then be removed, e.g., by heating the substrate to e.g., 620° C. in the presence of arsenic flux. After removal of the oxides from the GaAs substrate surface, the substrate is cooled to a temperature of about 580° C. A 0.5 μm-thick semi-insulating GaAs layer 23 is then grown on an upper surface of GaAs substrate 9 to act as a "buffer layer" and provide a smooth high-quality GaAs base layer for subsequent material growth. Growth of GaAs layer 23 (and of the other layers in the structure described herein) is typically done by MBE or MOCVD methods known in the art, though any other suitable growth mechanism can be used.

Next, a 1 μm-thick doped GaAs layer 1 (i.e., n+ layer 1 described above with respect to FIG. 1) is grown on an upper surface of semi-insulating GaAs layer 23, where GaAs layer 1 is doped with $10^{18}$ silicon atoms per cm$^3$. This layer will limit the width of the depletion region and will provide the n-contact to the device.

Next, a series of alternating layers of InAs quantum dots and GaAs barriers are grown to form a QD layer such as QD layer 2 described above with respect to FIG. 1. In an exemplary embodiment, 50 alternating layers each of the QDs and the GaAs barriers are grown, where the quantum dots comprise 1.7 monolayers of InAs and the total thickness of the GaAs barrier layers is 100 nm. For growth of each set of alternating layers, the substrate temperature is decreased to 520° C. for the QD growth, and then is increased back to 580° C. for growth of the GaAs barrier. Before the temperature is increased back to 580° C. for the growth of the GaAs barrier, the InAs quantum dots are covered with 10 nm of GaAs in order to prevent evaporation.

In the next fabrication step, a 0.3 μm-thick, $2\times10^{18}$ cm$^{-3}$ silicon-doped GaAs layer 3 (n-layer 3 described above with respect to FIG. 1) is then grown on an upper surface of QD layer 2.

Finally, a 1 μm-thick, $10^{18}$ cm$^{-3}$ beryllium-doped GaAs layer 4 (p+ layer 4 in FIG. 1) is grown on an upper surface of GaAs layer 3, where GaAs layer 4 serves as p-type top contact for voltage reverse biasing the device.

With this final layer growth, as illustrated in FIG. 7A, the semiconductor structure of the cell is completed.

The cell is further processed to form contacts to the device, as illustrated in FIG. 7B and as described below.

By the combined used of photolithography and controlled chemical etching, p+ GaAs layer 4, n-layer 3, and QD layer 2 are removed at the perimeter of the device, e.g., by using citric acid/H$_2$O$_2$ at 2.5:1 volumetric concentration ratio at room temperature. As shown in FIG. 7B, after completion of this etching step, n+ GaAs layer 1 becomes exposed.

As illustrated in FIG. 7C, a Ge/Au/Ni/Au (30/45/25/150 nm) metallic layer 11 is then selectively deposited on the top of n+ GaAs layer 1 and an Au/Zn/Au (10/30/150 nm) metallic layer 10 is selectively deposited over the p+ GaAs layer 4. The metallic layers 10 and 11 are annealed at 350° C. for 30 seconds, and after annealing, serve as the n-type and p-type contacts to the photodetector, respectively.

Thus, the present invention provides a photodetecting device that for the first time allows the detection of long wavelength infrared light using a capacitive detector with front illumination. This type of device is the corner stone of more complex devices such as the CCD that would allow also to register images for these wavelengths. The device can also be used as a pixel unit in more complex systems such as charge coupled image sensors, See M. F. Tompsett, G. F. Amelio, and G. E. Smith, "Charge Coupled 8-Bit Shift Register," *Appl. Phys. Lett.* 17, 111 (1970).

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A photodetector device comprising:
    an n-type quantum dot layer in a semiconductor heterostructure, the quantum dot layer comprising a plurality of quantum dots embedded within an n-type semiconductor host, an energy gap between valence and conduction bands of the quantum dot layer being smaller than an energy gap between valence and conduction bands of the semiconductor host;
    the n-type semiconductor host being n-doped to a doping density approximately equal to a density of the quantum dots embedded in the host such that a fundamental energy level of the semiconductor host is filled with electrons;

wherein electrons within the quantum dot layer are excited upon an application of a negative electrical bias to the device and are trapped within confined states in the quantum dots, the device having a first capacitance $\varepsilon/W'$ at a time t1 as a result of the presence of the trapped electrons, where $\varepsilon$ is an average dielectric permittivity of materials used in the photodetector and $W'$ is a space charge region of the device after the application of the electrical bias; and wherein upon an illumination of the device by light having a photon energy at least equal to a difference between an energy of the confined electrons and a conduction band energy in the quantum dot layer, a plurality of the trapped electrons are excited into a conduction band of the quantum dot layer, the device having a second capacitance $\varepsilon/W''$ at a time t2 as a result of the excitement of the trapped electrons, where $W''$ is a space charge region of the device after excitation of the plurality of the trapped electrons into the conduction band;

wherein a difference between $\varepsilon/W''$ and $\varepsilon/W'$ is indicative of an incidence of the light on the device.

2. The photodetector device according to claim 1, wherein the quantum dot layer comprises a plurality of InAs quantum dots embedded within a GaAs n-type semiconductor host.

3. The photodetector device according to claim 1, further comprising
a semi-insulating substrate;
an n+ layer grown on an upper surface of the substrate, the quantum dot layer being grown on an upper surface of the n+ layer;
an n-type layer grown on an upper surface of the n-type quantum dot layer; and
a p+ layer grown on an upper surface of the n-type layer, the n-type layer and the p+ layer forming a p-n junction, a thickness of the n-type layer being less than a thickness of a depletion region at the p-n junction.

4. The photodetector device according to claim 1, further comprising:
a substrate;
a p+ layer grown on top of the substrate;
an n-type layer grown on top of the p+ layer, the quantum dot layer being grown on an upper surface of the n-type layer; and
an n+-type semiconductor layer ("n+-layer") grown on top of the quantum dot layer, a thickness of the n-type layer being less than a thickness of a depletion region at a p-n junction.

5. The photodetector device according to claim 1, further comprising:
an n+ substrate, the quantum dot layer being grown on an upper surface of the n+ substrate;
an n-type layer grown on an upper surface of the n-type quantum dot layer; and
a p+ layer grown on an upper surface of the n-type layer, the n-type layer and the p+ layer forming a p-n junction, a thickness of the n-type layer being less than a thickness of a depletion region at the p-n junction.

6. The photodetector device according to claim 5, further comprising:
a first electrical contact connected to the p+ layer and a second electrical contact connected to the n+ substrate, the first electrical contact being in the form of a metal grid deposited on the p+ layer.

7. The photodetector device according to claim 5, further comprising an n+ layer disposed between the n-type layer and the n+ substrate.

8. The photodetector device according to claim 1, further comprising
a semi-insulating substrate;
an n+ layer grown on an upper surface of the substrate, the quantum dot layer being grown on an upper surface of the n+ layer;
an n-type layer grown on an upper surface of the n-type quantum dot layer; and
a metal layer grown on an upper surface of the n-type layer, the n-type layer and the metal layer forming Schottky contact, a thickness of the n-type layer being less than a thickness of a depletion region at a metal-n junction.

9. The photodetector device according to claim 1, further comprising
a semi-insulating substrate;
an n+ layer grown on an upper surface of the substrate, the quantum dot layer being grown on an upper surface of the n+ layer;
an n-type layer grown on an upper surface of the n-type quantum dot layer;
an insulating layer grown on top of the n-type layer and
a metal layer grown on an upper surface of the insulating layer, the metal layer, the insulator layer and the n-type layer forming a metal-insulator-semiconductor structure, a thickness of the n-type layer being less than a thickness that would extend a depletion region to the quantum dot layer.

10. A method for detecting an incidence of light on a semiconductor structure, comprising:
providing a photodetecting device, the photodetecting device comprising a semiconductor heterostructure having a quantum dot layer disposed between semiconductor layers, the quantum dot layer comprising a plurality of quantum dots embedded within an n-type semiconductor host, an energy gap between valence and conduction bands of the quantum dot layer being smaller than an energy gap between valence and conduction bands of the semiconductor host;
applying a negative bias voltage pulse to the heterostructure, the voltage pulse exciting electrons in the device and trapping the excited electrons into confined states within the quantum dots;
at time t1 after application of the voltage pulse, measuring a first capacitance $\varepsilon/W'$ of the device, where, $\varepsilon$ is an average dielectric permittivity of materials used in the photodetecting device and $W'$ is a space charge region of the device after the application of the voltage pulse; and
at time t2>t1, measuring a second capacitance $\varepsilon/W''$ of the device, $W''$ being a space charge region of the device resulting from excitation of a plurality of the trapped electrons into a conduction band of the device;
wherein a difference between $\varepsilon/W''$ and $\varepsilon/W'$ is indicative of an incidence of light having a photon energy at least equal to a difference between an energy of the confined electrons and a conduction band energy in the quantum dot layer.

11. The method according to claim 10, further comprising cooling the photodetecting device to inhibit an excitation of the trapped electrons through an absorption of thermal energy.

12. The method according to claim 10, wherein a degree of difference between $\varepsilon/W''$ and $\varepsilon/W'$ is indicative of an intensity of the light incident on the device.

* * * * *